United States Patent
Che et al.

(10) Patent No.: US 8,848,362 B1
(45) Date of Patent: Sep. 30, 2014

(54) FIRE PREVENTION IN A NETWORK DEVICE WITH REDUNDANT POWER SUPPLIES

(75) Inventors: Thuan Che, Fremont, CA (US); Jaspal Gill, Tracy, CA (US); Frank Krippendorf, San Ramon, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 457 days.

(21) Appl. No.: 13/044,198

(22) Filed: Mar. 9, 2011

(51) Int. Cl.
*H05K 7/20* (2006.01)

(52) U.S. Cl.
USPC ...... 361/679.46; 361/676; 361/695; 361/831; 700/300; 702/132; 713/300; 713/324

(58) Field of Classification Search
USPC .............. 361/676–678, 679.46–679.54, 361/688–722, 752, 794, 796, 810, 831
See application file for complete search history.

(56) References Cited

U.S. PATENT DOCUMENTS

| | | | |
|---|---|---|---|
| 6,259,172 B1 * | 7/2001 | Lee | 307/125 |
| 7,643,281 B2 * | 1/2010 | Okamoto et al. | 361/679.33 |
| 8,416,571 B2 * | 4/2013 | Mizumura et al. | 361/695 |
| 2002/0101714 A1 * | 8/2002 | Osecky et al. | 361/687 |
| 2004/0194978 A1 | 10/2004 | Jerg et al. | |
| 2005/0139366 A1 | 6/2005 | Scheidt | |
| 2006/0152356 A1 | 7/2006 | Yang et al. | |
| 2007/0044979 A1 | 3/2007 | Popp et al. | |
| 2008/0017393 A1 | 1/2008 | Whitney | |
| 2008/0135265 A1 | 6/2008 | Wagner et al. | |
| 2009/0205846 A1 | 8/2009 | Zeweke et al. | |
| 2010/0223085 A1 | 9/2010 | Gauthier et al. | |

\* cited by examiner

*Primary Examiner* — Courtney Smith
(74) *Attorney, Agent, or Firm* — Harrity & Harrity, LLP

(57) ABSTRACT

A device may include multiple power supplies that are cooled by a system fan. The power supplies may be cross-connected to supply power to one another and the device may monitor temperatures of the power supplies. Based on the temperatures of the power supplies, the device may determine whether any of the power supplies are likely to be on fire. The device may shut off the fan when a power supply is determined to be likely to be on fire.

12 Claims, 7 Drawing Sheets

FIRE PREVENTION IN A NETWORK DEVICE WITH REDUNDANT POWER SUPPLIES

BACKGROUND

Network devices, such as routers, security devices (e.g., firewalls), switches, or other network devices, may include multiple power supplies for added network device reliability. The power supplies may be redundantly configured so that either of the multiple power supplies may independently power the network device. The power supplies may also be hot-swappable so that one of the redundant power supplies can be replaced without disrupting operation of the network device.

Network devices installed in certain locations may be required to pass environmental design guidelines, such as guidelines stipulated by law or by industry standard. For example, the Network Equipment Building System (NEBS) standard GR-63-CORE is a commonly used set of safety and environmental design guidelines for telecommunications equipment. Under NEBS, during a fire test, the power supply unit under test is set on fire via a gas burn injected into the (horizontal) air flow inlet of one of the power supplies of the network device for 120 seconds. After the injected gas burn, the power supply is required to self-extinguish the fire and flames and burning particles should not exit from the network device.

Network devices with redundant power supplies have an increased risk of failing the NEBS fire test, as one of the redundant power supplies may continue to run and to power fans of the network device. The running fans may stimulate the fire in the power supply being tested.

SUMMARY

One implementation may be directed to a device comprising a first power supply to generate power for the device. The first power supply may include a first temperature sensor to measure a temperature of the first power supply and a first communication component to transmit the measured temperature of the first power supply. The device may further include a second power supply to generate power for the device, the second power supply including: a second temperature sensor to measure a temperature of the second power supply and a second communication component to transmit the measured temperature of the second power supply. Power signals from the first power supply and the second power supply may be cross-connected with one another, in the device, to redundantly power the first temperature sensor, the first communication component, the second temperature sensor, and the second communication component. The device may further include at least one fan, located within the device and external to the first and second power supplies. The device may further include a fan control component to receive the measured temperatures from the first and second power supplies, determine, based on the measured temperatures from the first and second power supplies, when one of the measured temperatures from the first and second power supplies include a temperature value indicating that the first or second power supply is likely to be experiencing a fire, and shut off operation of the at least one fan in response to the determination that the first or second power supply is likely to be experiencing a fire.

In another implementation, a device may include a first power supply slot to receive a first removable power supply to generate power for the device and a second power supply slot to receive a second removable power supply to generate power for the device. The device may further include at least one fan, located within the device and external to the first and second power supply slots. The device may further include a midplane to connect components of the device, the midplane including at least one electrical path to cross-connect logic level power signals generated by the first and second removable power supplies, and at least one control signal path. The device may further include a fan control component to receive temperature signals over the control signal path, determine, based on the received temperature signals, whether a fire is occurring in the device, and shut off operation of the at least one fan when a fire is determined to be occurring in the device.

In another implementation, device implemented method may include monitoring temperature measurements of power supplies in the device, the power supplies being cross-connected to supply power to one another. The method may further include determining, based on the temperature measurements, whether any of the power supplies are likely to be on fire; and shutting off one or more fans of the device in response to the determination that at least one of the plurality of the power supplies are likely to be on fire.

BRIEF DESCRIPTION OF THE DRAWINGS

The accompanying drawings, which are incorporated in and constitute a part of this specification, illustrate one or more implementations described herein and, together with the description, explain the invention. In the drawings.

DETAILED DESCRIPTION

The following detailed description refers to the accompanying drawings. The same reference numbers in different drawings may identify the same or similar elements.

Techniques described herein may relate to fire prevention and extinguishment in network devices. A network device may include multiple power supplies that are cooled by a system fan. In one implementation, a logic level power line, such as a power line that can be used to power a temperature sensor, may be cross-routed between the two power supplies so that a temperature sensor in each power supply may be redundantly powered from either power supply. When one of the temperature sensors registers an abnormally high temperature reading that may indicate a fire, the network device may shut off one or more of the system fans to limit and/or stop the spread of the fire. Because the temperature sensors, in the power supplies, include a power connection from the other power supply, the temperature sensor may continue to function despite a failure (e.g., due to the fire) of the power supply local to the temperature sensor.

Figure 1A:
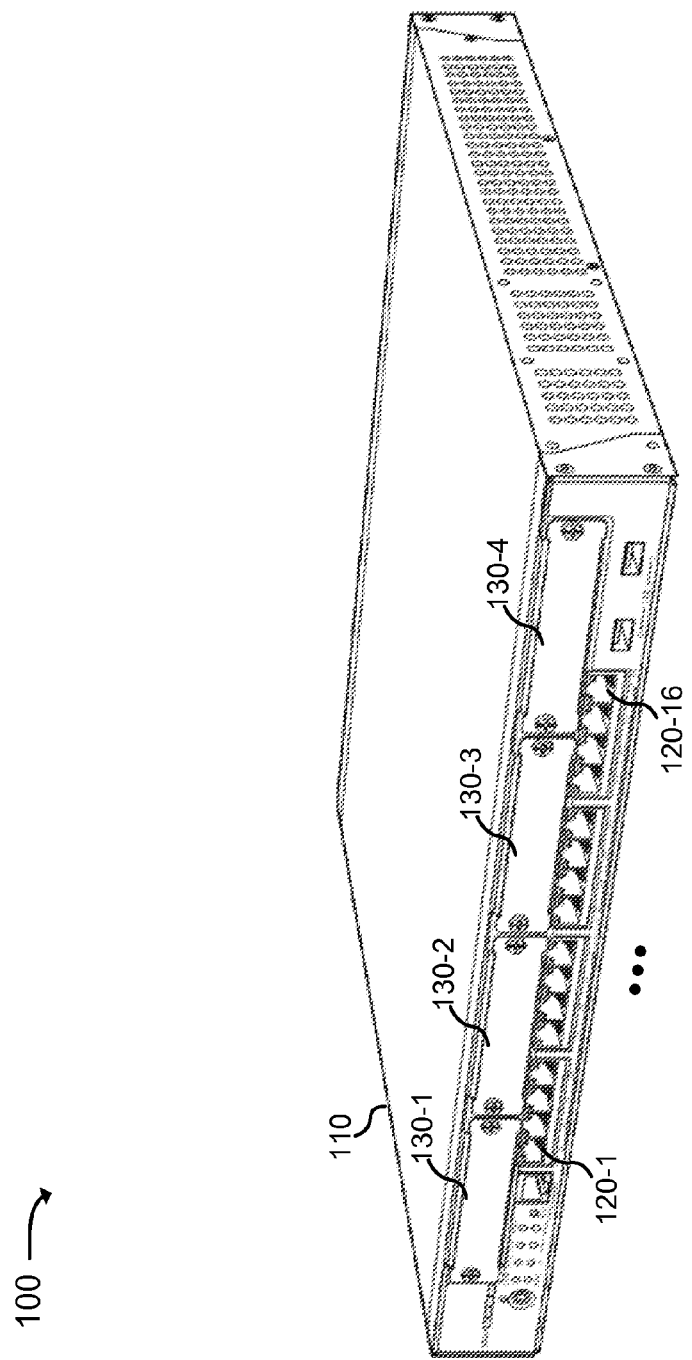
FIGS. 1A and 1B are diagrams illustrating perspective views of an example network device in which implementations described herein may be implemented.
Figure 1B:
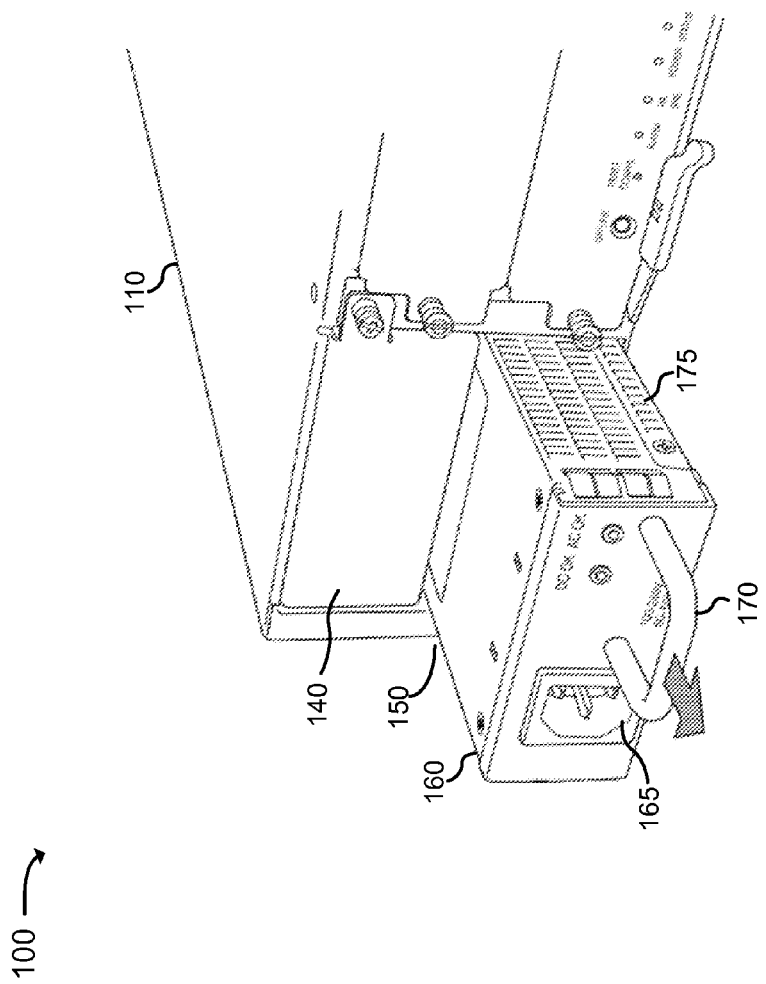

FIGS. 1A and 1B are diagrams illustrating perspective views of an example network device 100 in which implementations described herein may be implemented. Network device 100 may include a network device, such as a router, switch, firewall, combined router/firewall, or another type of network device. In one implementation, network device 100 may include a secure router that supports features such as a firewall and virtual private network (VPN) services. In other possible implementations, network device 100 may implement other types of network devices.

FIG. 1A is an example of a front view of network device 100. As shown, network device 100 may include a chassis 110. Chassis 110 may include a number of ports 120-1 to 120-16 (referred to collectively as "ports 120" or singularly as "port 120") and expansion slots 130-1 to 130-4 (referred to collectively as "expansion slots 130" or singularly as "expansion slot 130"). Each port 120 may include a physical slot into which a cable, such as an Ethernet cable, may be inserted. In some implementations, network device 100 may include connections for other types of links, such as optical links. Expansion slots 130 may include slots into which additional components, such as slide-in cards, may be added to enhance the functionality of network device 100. Expansion slots 130 may be used to add, for example, additional ports, additional processing capacity, or other components to network device 100.

FIG. 1B is an example of a back view of a portion of network device 100. Network device 100 may include slots 140 and 150 for inserting power supplies. An example power supply 160, partially inserted into slot 150, is also shown in FIG. 1B.

Slots 140 and 150 may each accept a power supply, such that network device 100 can be configured as a redundant dual power supply system, in which each power supply may be capable of supporting the entire load of network device 100. Accordingly, network device 100 may continue to function after the failure or removal of one power supply. In one implementation, slots 140 and 150 may be hot swappable so that, as long as at least one power supply 160 remains inserted into network device 100, another power supply 160 can be removed/inserted while network device 100 continues to operate.

Power supply 160 may include an alternating current (AC) plug 165, for connecting to an AC power supply, a handle 170 for removing and inserting of power supply 160 into chassis 110 of network device 100, and cooling vents 175. Internally, power supply 160 may convert the input AC power to direct current (DC) power and supply the DC power to the operational components of network device 100. Power supply 160 may be designed to be a fanless device that is cooled using air flow that is moved through cooling vents 175 by cooling fans located among the operational components of network device 100.

Figure 2:
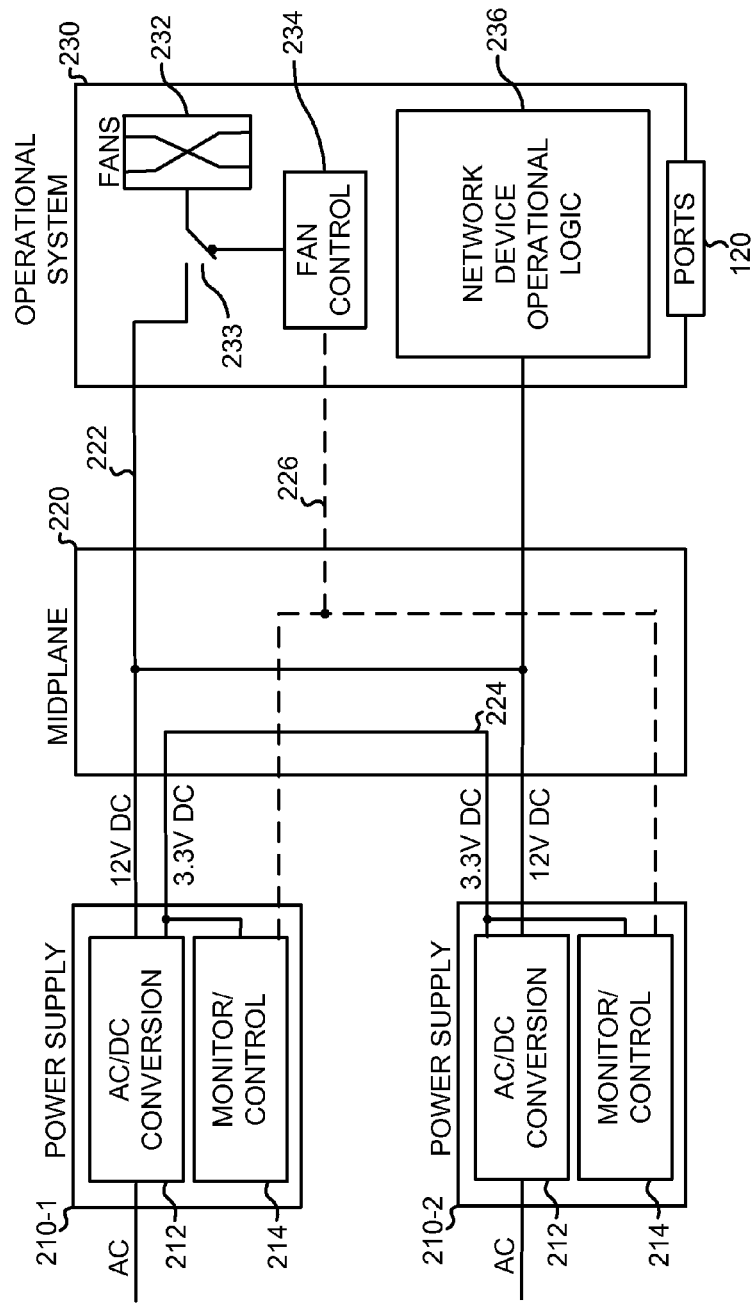
FIG. 2 is a diagram illustrating an example of an implementation of the network device shown in FIGS. 1A and 1B.

FIG. 2 is a diagram illustrating an example of an implementation of network device 100. As shown, network device 100 may be structured as three logical units: a power supply section, including multiple power supplies, labeled as power supplies 210-1 and 210-2; a midplane 220; and an operational system 230.

Power supplies 210-1 and 210-2 may each be hot-swappable power supplies, such as power supplies corresponding to power supply 160. Each power supply 210 may include an AC/DC conversion component 212 and a monitor/control component 214. AC/DC conversion component 212 may operate to convert AC input power to DC output power that may be used by operational system 230. AC/DC conversion component 212 may output one or more regulated DC power signals. For example, AC/DC conversion component 212 may output a 12V power line and a 3V power line to operational system 230. In one implementation, AC/DC conversion component 212 may include a switched-mode power supply.

Monitor/control component 214 may include logic to monitor and/or control the operation of power supply 210. For example, monitor/control component 214 may include a temperature sensor to take temperature readings of power supply 210 and communication circuitry, such as a buffer, to transmit the temperature readings to operational system 230.

Midplane 220 may include one or more electrical connections in network device 100 that connect various components of network device 100. Midplane 220 may include data distribution paths, control signal paths, and/or power distribution paths. In FIG. 2, power distribution paths 222 (12V path) and 224 (3.3V path) are particularly shown. Power distribution path 222 may provide a 12V power signal from each one of power supplies 210-1 and 210-2 to operational system 230. Power distribution path 224 may provide a 3.3V power signal path between power supplies 210-1 and 210-2. Power distribution path 224 may particularly provide power to monitor/control components 214. Because power distribution path 224 is sourced from both of power supplies 210-1 and 210-2, both monitor/control components 214 may continue to receive power despite the failure of one of power supplies 210-1 or 210-2. In addition to power distribution paths, midplane 220 may include other paths, such as control path 226, which may include a bus through which control information, such as temperature measurements, may be transmitted from monitor/control components 214 to operational system 230.

In one implementation, control path 226 may be a shared control path, such as an PC (Inter-Integrated Circuit) bus, a 1-wire bus, or other type of serial communication path or bus.

Operational system 230 may generally include one or more components to perform the substantive processing of network device 100. For example, for a security router, operational system 230 may include logic to perform routing and/or switching functions, firewall functions, and/or VPN functions. As shown in FIG. 2, operational system 230 may include one or more fans 232, switches 233, a fan control component 234, and network device operational logic 236. Data, such as packet data from external devices, may be received and transmitted by operational system 230 through ports 120.

Fans 232 may include one or more fans that are used to cool network device 100. Fans 232 may be used to cool operational system 230. In one implementation, power supplies 160/210 may be fanless power supplies that may include vents, such as cooling vents 175, that allow airflow from fans 232 to also cool power supplies 160/210. Fan control component 234 may control fans 232. For instance, fan control component 234 may adjust the rotational speed and/or selectively turn on/off fans 232 in order to maintain the correct operational temperatures of network device 100. Fan control component 234 may receive temperature signals, such as temperature readings from monitor/control component 214 via control path 226. Fan control component 234 may also receive temperature signals from other components of network device 100, such as from network device operational logic 236. Although shown as a separate component in FIG. 2, in some implementations, fan control component 234 may be implemented as part of network device operational logic 236, such as part of control software implemented by network device operational logic 236.

Switches 233 may include transistors, mechanical switches, or other switches that may be used to control the rotational speed or on/off state of fans 232. In one implementation, each fan of fans 232 may be individually controlled through an associated switch. In an alternative implementation, all of fans 232 may be controlled as a group.

Network device operational logic 236 may perform the substantive data processing operations of network device 100. When network device 100 is a router, network device operational logic 236 may include, for example, a hardware component, such as an application specific integrated circuit (ASIC), to quickly and efficiently process and switch packets incoming at one of ports 120 to another outbound port 120, based on header information in the packet. Network device operational logic 236 may also include one or more general purpose processors to perform other functions, such as functions relating to the implementation of routing or other network protocols, device management, and/or other software functions.

Although FIGS. 1 and 2 illustrate example components of network device 100, in some implementations, network device 100 may include fewer components, different components, differently arranged components, or additional components than those depicted in FIGS. 1 and 2. Additionally, or alternatively, one and/or more components of network device 100 may perform one or more tasks described as being performed by one or more other components of network device 100.

Figure 3:
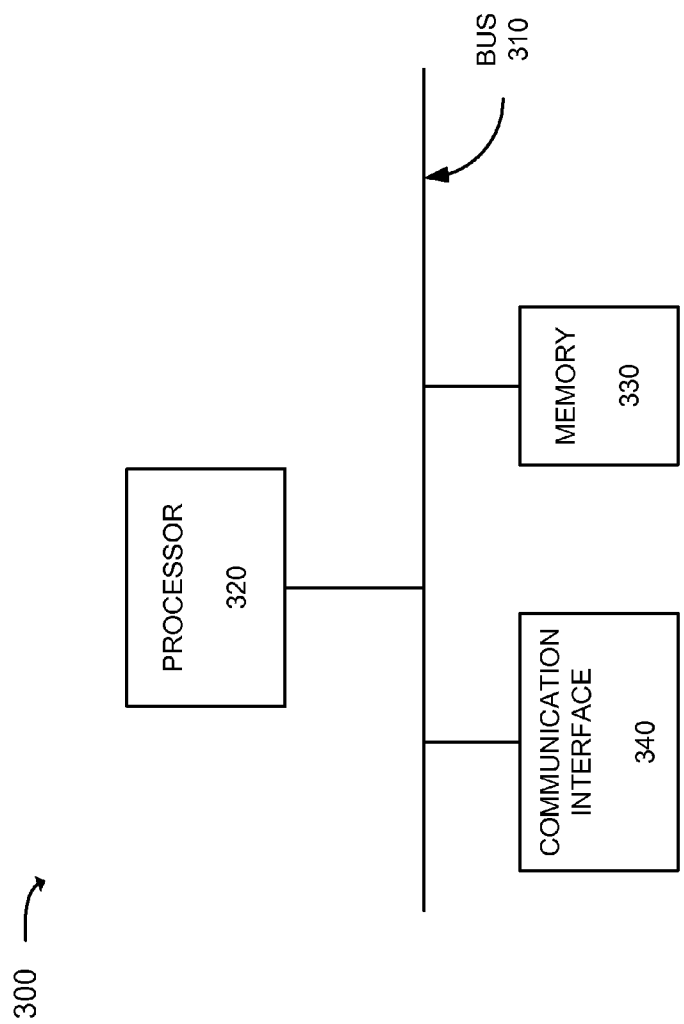
FIG. 3 is a diagram illustrating an example of a device (or a portion of a device) that may be included in the network device shown in FIGS. 1A and 1B.

FIG. 3 is a diagram illustrating an example of a device 300 (or a portion of a device) that may be included in network device 100. Device 300 may be used to implement, for example, portions of network device operational logic 236 and/or fan control component 234. As shown, device 300 may include a bus 310, a processor 320, a memory 330, and a communication interface 340.

Bus 310 may permit communication among the components of device 300. Processor 320 may include one or more processors and/or microprocessors that interpret and execute instructions. Additionally or alternatively, processor 320 may be implemented as or include one or more application-specific integrated circuit (ASICs), field-programmable gate array (FPGAs), or the like. Memory 330 may include a RAM or another type of dynamic storage device that stores information and instructions for execution by processor 320, a ROM or another type of static storage device that stores static information and instructions for the processor 320, and/or some other type of magnetic or optical recording medium and its corresponding drive for storing information and/or instructions.

Communication interface 340 may include any transceiver-like mechanism that allows device 300 to communicate with other devices and/or systems. For example, communication interface 340 may include mechanisms for communicating with monitor/control components 214.

As will be described in detail below, device 300 may perform certain functions in response to processor 320 executing software instructions contained in a non-transitory computer-readable medium, such as memory 330. The software instructions may be read into memory 330 from another computer-readable medium or from another device via communication interface 340. The software instructions contained in memory 330 may cause processor 320 to perform processes that will be described later. Alternatively, hardwired circuitry may be used in place of or in combination with software instructions to implement processes consistent with embodiments described herein. Thus, systems and methods described herein are not limited to any specific combination of hardware circuitry and software.

Although FIG. 3 illustrates example components of device 300, in some implementations, device 300 may include fewer components, different components, differently arranged components, or additional components than those depicted in FIG. 3. Additionally, or alternatively, one or more components of device 300 may perform one or more tasks described as being performed by one or more other components of device 300.

Figure 4:
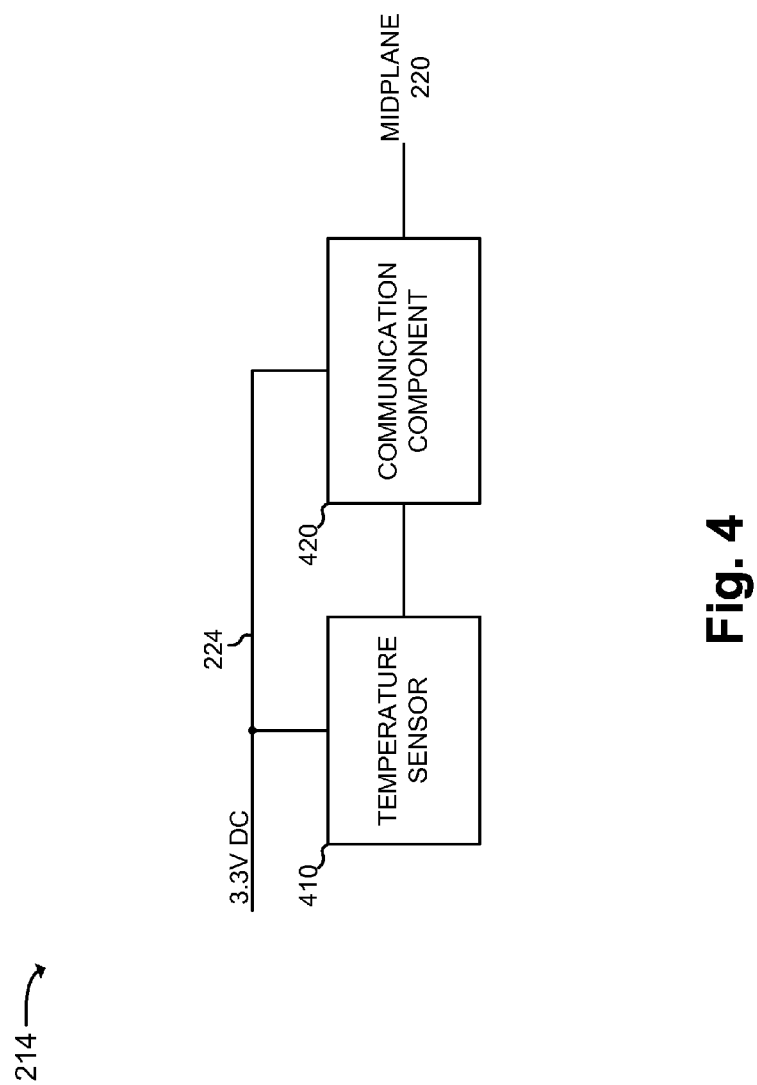
FIG. 4 is a diagram illustrating an example of functional elements of the monitor/control component shown in FIG. 2.

FIG. 4 is a diagram illustrating an example of functional elements of monitor/control component 214. Monitor/control component 214 may include a temperature sensor 410 and a communication component 420. Temperature sensor 410 and communication component 420 may be powered by a redundant power supply, such as power distribution path 224 (e.g., a 3.3V power line that is supplied by power supplies 210-1 and/or 210-2).

Temperature sensor 410 may take temperature readings of its power supply 210. Temperature sensor 410 may include, for example, a thermistor or another type of temperature sensor. In one implementation, temperature sensor 410 may be a sensor that is designed to operate over a relatively large range, such as a range including temperature values that may be much higher than would be expected during normal operation of power supply 210, such as up to temperatures that may occur during a fire in power supply 210 (e.g., a temperature value during normal operation may be 50 degrees C. and a temperature value during a fire may be 500 degrees C.).

Communication component 420 may include logic to transmit information, such as temperature measurements from temperature sensor 410, to operational system 230 (i.e., over midplane 220). Communication component 420 may include, for example, a buffer to store and source the measured temperature values over control path 226 to fan control component 234. Alternatively or additionally, communication component 420 may include logic (e.g., an integrated circuit) to implement a communication protocol over control path 226. Communication component 420 may alternatively or additionally include other elements, such as an Electrically Erasable Programmable Read-Only Memory (EEPROM) that may store an identifier of the power supply. In this implementation, each power supply 210 may include a different identifier and each temperature reading may be transmitted to fan control component 234 with its corresponding power supply identifier. In this manner, fan control component 234 may receive, over a shared control communication path, temperature readings (and potentially other state/monitor information), from power supplies 210. As will be described in more detail below, fan control component 234 may control fans 232 based on the temperatures of power supplies 210.

In one implementation, temperature sensor 410 and communication component 420 may be placed in power supply 210 in a way that makes a fire occurrence in power supply 210 unlikely to disrupt the operation temperature sensor 410 and communication component 420. For example, temperature sensor 410 and communication component 420 may be physically separated from AC/DC conversion component 212 or "hardened" in some way (e.g., by enclosing temperature sensor 410 and communication component 420 in an air-tight container) to make temperature sensor 410 and communication component 420 resistant to fire.

Although FIG. 4 illustrates example functional elements of monitor/control component 214, in some implementations, monitor/control component 214 may include fewer components, different components, differently arranged components, and/or additional components than those depicted in FIG. 4. Additionally, or alternatively, one or more components shown in FIG. 4 may perform one or more tasks described as being performed by one or more other components.

Figure 5:
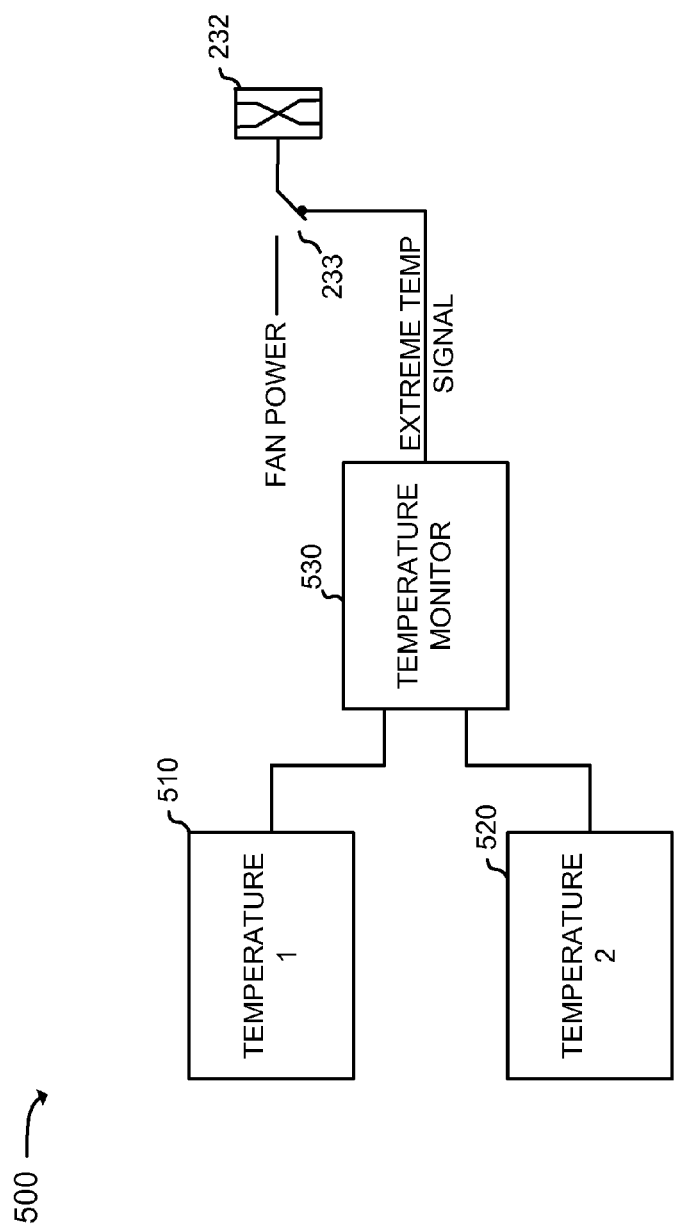
FIG. 5 is diagram conceptually illustrating an example of functional components for preventing the spread of fire in a network device.

FIG. 5 is diagram conceptually illustrating an example of functional components 500 for preventing the spread of fire in a network device. Functional components 500 may be implemented by, for example, a combination of temperature sensor 410, communication component 420, and fan control component 234. Functional components 500 may include temperature 510, temperature 520, temperature monitor 530, switches 233, and fans 232.

Functional components 500 may receive multiple temperature measurement values, labeled as temperature 510 (temperature 1) and temperature 520 (temperature 2). As previously discussed, the temperature values may correspond to temperature readings from within power supplies 210-1 and 210-2. The temperature of each power supply 210 may be measured by temperature sensors 410, transmitted over midplane 220 (e.g., via control path 226), and received by temperature monitor 530.

Temperature monitor 530 may monitor temperature 510 and temperature 520. Temperature monitor 530 may determine when one of temperatures 510 or 520 increases to a value above a first threshold. The threshold may be selected as a temperature that is above the normal operation of one of power supplies 210, such as a temperature value that is consistent with a fire in the power supply. In one implementation, temperature monitor 530 may determine when one of temperatures 510 or 520 is above the first threshold while the other one of temperatures 510 or 520 remain within a normal range. Alternatively, temperature monitor 530 may determine whether either one of temperatures 510 or 520 is above the first threshold (without regard to the other temperature 510 or 520). When this condition is satisfied, temperature monitor 530 may output an "extreme temperature signal." In one implementation, the extreme temperature signal, when activated, may control switches 233 to cut-off power supplied to fans 232. Stopping the operation of fans 232 may reduce airflow through network device 100, and thus decrease the potential for the fire to spread outside of network device 100 and/or help to extinguish the fire. In some implementations, various fans 232 may control airflow in various portions of network device 100. For example, a first fan may provide airflow to power supply 210-1 and a second fan may provide airflow to power supply 210-2. In this situation, temperature monitor 530 may only stop the operation of the fan that provides airflow to the power supply in which an extreme temperature is detected.

In one implementation, temperature monitor 530, in addition to controlling fans 232, may perform other actions in response to the detection of an extreme temperature. For example, in response to detection of an extreme temperature, temperature monitor 530 may turn off other elements in power supplies 210 and may transmit an alert to an administrator or may perform other functions.

Although FIG. 5 illustrates example functional elements 500, in some implementations, monitor/control component 214 may include fewer components, different components, differently arranged components, or additional components than those depicted in FIG. 5. Additionally, or alternatively, one or more components shown in FIG. 5 may perform one or more tasks described as being performed by one or more other components.

Figure 6:
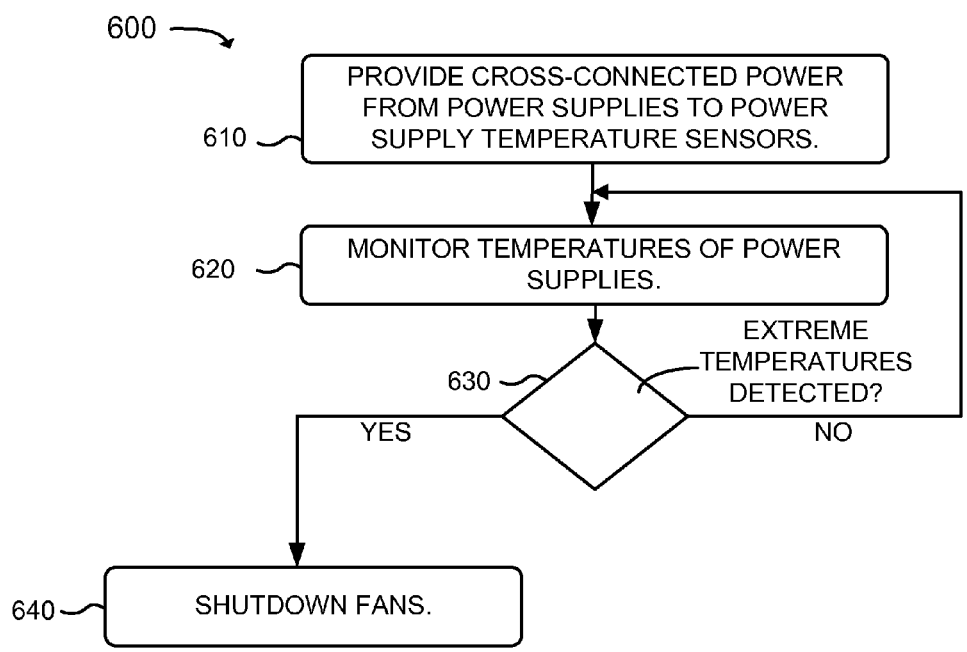
FIG. 6 is a flow chart illustrating an example process for preventing the spread of fire in a network device.

FIG. 6 is a flow chart illustrating an example process 600 for preventing the spread of fire in a network device.

Process 600 may include providing cross-connected power from power supplies 210 (block 610). The cross-connected power from power supplies 210 may be designed to supply backup logic level operational power to temperature sensors (and communication logic needed to communicate temperature readings) in power supplies 210 (block 610). For example, as shown in FIG. 2, network device 100 may include a power signal path 224 that is routed through midplane 220 and that connects to the output power of each power supply 210 and to monitor/control component 214 of each power supply 210.

Process 600 may also include monitoring the temperatures of power supplies 210 (block 620). As previously discussed, monitor/control components 214 may include temperature temperature sensors 410 that may transmit, via control path 226, temperature readings to operational system 230. Fan control component 234 in operational system 230 may compare the read temperature values to threshold values. The threshold values may be, for example, set during design or manufacture of network device 100.

Process 600 may further include determining when an extreme temperature is detected (block 630). For example, an extreme temperature may be detected when a measured temperature is greater than the threshold value. Detection of an extreme temperature may indicate that a fire is occurring in one of power supplies 210 of network device 100. In response to detection of an extreme temperature (block 630—YES), process 600 may further include shutting down the fans of network device 100 (block 640). As previously discussed, switches 233 may be used to turn off one or more of fans 232 in network device 100. When an extreme temperature is not detected, (block 630—NO), process 600 may continue to monitor the temperatures of power supplies 210 (block 620).

In some implementations, after the fans are shutdown (block 640), the temperature of power supplies 210 may continue to be monitored. If the temperature reduces to a normal level, the fans may be restarted.

As described above, fires in a power supply of a network device may be detected even when the power supply that is on fire has failed. Fans in the network device may be stopped to assist in the extinguishment of the fire.

It will also be apparent that aspects described herein may be implemented in many different forms of software, firmware, and hardware in the implementations illustrated in the figures. The actual software code or specialized control hardware used to implement aspects described herein is not intended to limit the scope of the invention. Thus, the operation and behavior of the aspects were described without reference to the specific software code—it being understood that software and control hardware can be designed to implement the aspects based on the description herein.

While series of blocks have been described in FIG. 6, the order of the blocks may vary in other implementations. Also, non-dependent blocks may be performed in parallel.

Even though particular combinations of features are recited in the claims and/or disclosed in the specification, these combinations are not intended to limit the invention. In fact, many of these features may be combined in ways not specifically recited in the claims and/or disclosed in the specification. Although each dependent claim listed below may directly depend on only one other claim, the disclosure of the invention includes each dependent claim in combination with every other claim in the claim set.

Further, certain aspects described herein may be implemented as "logic" or as a "component" that performs one or more functions. This logic or component may include hardware, such as an ASIC or a FPGA, or a combination of hardware and software.

No element, act, or instruction used in the description of the present application should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise. The scope of the invention is defined by the claims and their equivalents.

What is claimed is:

1. A device comprising:
a first power supply slot to receive a first removable power supply to generate power for the device;
a second power supply slot to receive a second removable power supply to generate power for the device;
at least one fan, located within the device and external to the first and second power supply slots;
a midplane to connect components of the device, the midplane including:
at least one electrical path to cross-connect logic level power signals generated by the first and second removable power supplies, and
at least one control signal path; and
a fan control component to:
receive temperature signals over the at least one control signal path,
determine, based on the received temperature signals, whether a fire is occurring in the device, and
shut off operation of the at least one fan when the fire is determined to be occurring in the device.

2. The device of claim 1, further comprising:
network device operational logic to perform network operations.

3. The device of claim 2, further comprising:
a plurality of ports through which the network device operational logic receives and transmits packets.

4. The device of claim 1, where the at least one fan includes:
a plurality of fans located within the device and external to the first and second power supply slots, and
where the fan control component shuts off operation of select ones of the plurality of fans based on a determination that the fire is occurring in the device.

5. The device of claim 1, where the determination of whether the fire is occurring in the device is based on a comparison of the received temperature signals to a threshold temperature value.

6. The device of claim 1, where the device includes a router, a switch, or a firewall.

7. The device of claim 1, where the at least one control signal path includes a serial communication bus.

8. A method comprising:
receiving, by a first power supply slot of a device, a first removable power supply to generate power for the device;
receiving, by a second power supply slot of the device, a second removable power supply to generate power for the device,
at least one fan being located within the device and being external to the first power supply slot and the second power supply slot;
receiving, by a fan control component of the device, temperature signals over at least one control signal path included in a midplane of the device,
the midplane to connect components of the device,
the midplane further including at least one electrical path to cross-connect logic level power signals generated by the first removable power supply and the second removable power supply;
determining, by the fan control component of the device and based on the received temperature signals, whether a fire is occurring in the device; and
shutting off, by the fan control component of the device, the at least one fan when the fire is occurring in the device.

9. The method of claim 8, where determining whether the fire is occurring includes comparing the temperature signals to a threshold temperature value.

10. The method of claim 8, further comprising:
performing network operations using network device operational logic of the device.

11. The method of claim 8, further comprising:
receiving and transmitting packets via a plurality of ports of the device.

12. The method of claim 8, where the at least one fan includes:
a plurality of fans located within the device and external to the first power supply slot and the second power supply slot, and
where shutting off the at least one fan includes:
selectively shutting off ones of the plurality of fans when the fire is occurring in the device.

* * * * *